(12) United States Patent
Minas et al.

(10) Patent No.: US 6,717,408 B2
(45) Date of Patent: Apr. 6, 2004

(54) SUPPORT STRUCTURE FOR OPEN MRI APPARATUS

(75) Inventors: Constantinos Minas, Slingerlands, NY (US); F. Scott Murray, Schenectady, NY (US)

(73) Assignee: Intermagnetics General Corporation, Latham, NY (US)

( * ) Notice: Subject to any disclaimer, the term of this patent is extended or adjusted under 35 U.S.C. 154(b) by 0 days.

(21) Appl. No.: 09/826,655

(22) Filed: Apr. 5, 2001

(65) Prior Publication Data
US 2002/0145426 A1 Oct. 10, 2002

(51) Int. Cl.[7] ................................................ G01V 3/00
(52) U.S. Cl. ...................................... 324/318; 324/307
(58) Field of Search ............................. 324/318, 322, 324/309, 307, 319

(56) References Cited

U.S. PATENT DOCUMENTS

| 4,829,252 A | 5/1989 | Kaufman |
| 5,436,607 A | 7/1995 | Chari et al. |
| 5,563,566 A | 10/1996 | Laskaris et al. |
| 5,812,043 A | 9/1998 | Gore et al. |
| 5,900,793 A | 5/1999 | Katznelson et al. |
| 5,936,502 A | 8/1999 | Englund et al. |
| 6,313,632 B1 * | 11/2001 | Aoki et al. ................. 324/318 |

* cited by examiner

Primary Examiner—Diego Gutierrez
Assistant Examiner—Dixomara Vargas
(74) Attorney, Agent, or Firm—Katten Muchin Zavis Rosenman (57) ABSTRACT

An open or split type MRI apparatus has two axially spaced magnet coil half sections separated and supported by a compact support structure. Only two diametrically opposed supports are needed to react the high axial and torsional loads produced or received by the MRI apparatus. One support is loaded under pure compression, and the other support is loaded under compression and tension.

21 Claims, 10 Drawing Sheets

SUPPORT STRUCTURE FOR OPEN MRI APPARATUS

BACKGROUND OF THE INVENTION

The present invention relates in general to structural supports for magnetic resonance imaging (MRI) apparatus and relates in particular to an open MRI apparatus having axially-spaced pairs of magnet coils supported by a pair of diametrically opposed supports.

DESCRIPTION OF PRIOR DEVELOPMENTS

An MRI magnet is characterized as open when there is an accessible, room temperature, physical gap provided between a pair of superconducting magnet coils. An open MRI magnet is desirable as it improves patient comfort and accessibility as compared to closed MRI magnets which many patients consider uncomfortable and which limit patient access.

In order to provide the desired openness and create an open gap around a patient imaging region, a pair of magnet coil assemblies can be separated into two axially-spaced half sections. The half sections of the magnet produce high attractive magnetic forces which must be reacted with a structural support system that separates and supports the half sections and prevents the magnet coils from collapsing upon one another.

Typical axial forces for a 1.0 T MRI magnet are in the range of about 160,000 lbs. (711 KN). Prior MRI support structures reacted these axial forces by an arrangement of axial posts which interconnected the two magnet half sections. The numerous posts limited the openness of the magnet.

An MRI support structure must not only axially separate and axially support the two magnet half sections during operation of the MRI apparatus, the support structure should also provide circumferential support to accommodate torsional or twisting forces which may be applied to the half sections during, for example, shipping, installation, mobile and normal operation. Moreover, it is desirable to provide such a support system which resists the transmission of floor-induced vibrations from the surrounding building structure to the MRI apparatus.

Accordingly, a need exists for a robust support structure for an open MRI apparatus which reacts high axial loads produced during operation of the apparatus, without adversely affecting the openness of the gap defined between two MRI magnet half sections.

A further need exists for such a structure which reacts tensile and compressive loads produced by a pair of MRI half sections as well as any torsional loads which may be applied to the half sections.

Another need exists for a support structure for an open MRI magnet assembly which resists the transmission of vibrations from the surrounding building floor.

SUMMARY OF THE INVENTION

The present invention has been developed to fulfill the needs noted above and therefore has as an object the provision of a support structure for axially separating and supporting a pair of superconducting magnet half sections without adversely affecting the openness of the patient gap defined between the two magnet half sections.

A further object of the invention is the provision of such a support structure which uses only two dramatically opposed supports for connecting together two MRI half sections to provide a high degree of openness with a minimum of patient obstruction.

Another object of the invention is to provide such a support structure which is compact in size.

Another object of the invention is the provision of a pair of axially-extending support assemblies having dissimilar or unequal constructions, dissimilar or unequal cross sections and which react loads differently.

Still another object of the invention is the provision of such a support structure which has very high bending, shear and torsional natural frequencies so as to make the MRI apparatus more tolerant to floor induced vibrations.

These and other objects are met by the present invention which is directed to a support structure for interconnecting and supporting a pair of half magnet sections of an MRI apparatus. The support structure includes two axially-extending supports or columns located diametrically opposite one another on the outer circumferential periphery of a pair of MRI magnet coil half sections. The opposed supports have unequal structural configurations and different cross sections and accommodate different types of loading.

The support with the larger cross section is advantageously constructed with a compressive load bearing member and one or more tension load bearing members. These compressive and tensile load bearing members react only a portion of the axial magnetic force produced between the two magnet half sections. The remainder of the load is reacted by a second, much smaller support member that reacts only compressive axial forces.

The larger support is radially offset to one side of the magnet assembly to enable the open magnet to maintain a high degree of openness and to improve patient comfort and accessibility. In order to provide for the flow of cryogenic fluid, such as liquid helium, between the two magnet half sections, at least the larger support includes a hollow fluid flow portion.

To further enhance the openness of the MRI system, the outer vacuum container can be formed with an inner and outer conical portion to further reduce encroachment of the structure into the region of the imaging gap.

Other objects, features and advantages of the present invention will be readily appreciated as the same becomes better understood after reading the subsequent description taken in conjunction with the accompanying drawings.

BRIEF DESCRIPTION OF THE DRAWINGS

In the Drawings:

FIG. 2A is an axial cross sectional view of an MRI apparatus constructed in accordance with the present invention taken along section line 2A—2A of the representative helium vessel of FIG. 1. FIG. 2A is sectioned through the top half of a pair of diametrically opposed supports and is a mirror image of the lower half of the helium representative vessel of FIG. 1.

FIG. 2B is an axial cross sectional view of a lower magnet half section similar to FIG. 2A, taken along sectional line 2B—2B of FIG. 1 and is circumferentially rotated 90° from the upper magnet half section shown in FIG. 2A;

In the various views of the drawings like reference characters denote like or similar parts

DETAILED DESCRIPTION OF THE PREFERRED EMBODIMENTS

Figure 1:
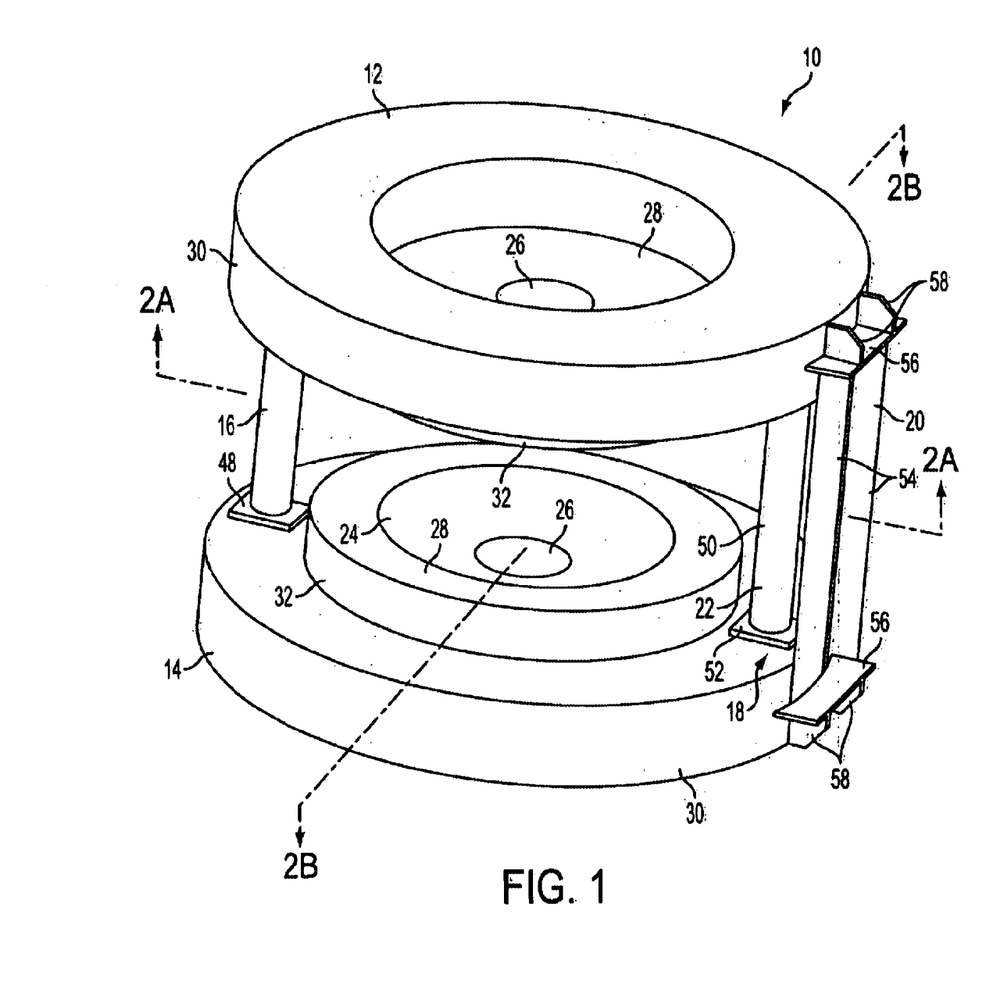
FIG. 1 is a schematic perspective view of a helium vessel of an MRI apparatus constructed in accordance with the present invention.

The present invention will now be described in conjunction with the drawings, beginning with FIG. 1 which shows a helium vessel 10 constructed in accordance with the present invention. Helium vessel 10 includes a first or upper magnet half section 12 and a second or lower magnet half section 14. Magnet half sections 12 and 14 are substantially mutually symmetrical and take the form of annular hollow members aligned coaxially with one another.

The magnet half sections 12, 14 are axially connected and supported by a first axially-extending support 16 and a second axially-extending support 18. Support 16 may take the form of a cylindrical post or pipe. Support 18 includes a radially outer portion 20 and a radially inner portion 22. Supports 16 and 18 are disposed diametrically opposed to one another on opposite sides of the substantially cylindrical magnet half sections 12, 14. An axial gap 24 is defined between the magnet half sections 12, 14 to provide an imaging region for a patient.

A central opening 26 may be formed through each magnet half section 12, 14. Each magnet half section includes an axially and radially inner annular main coil portion 28 and an axially and radially outer shield coil portion 30. The main and shield coil portions 28, 30 are coaxially aligned with one another and define an axial step 32 between them.

Figures 2A, 2B:
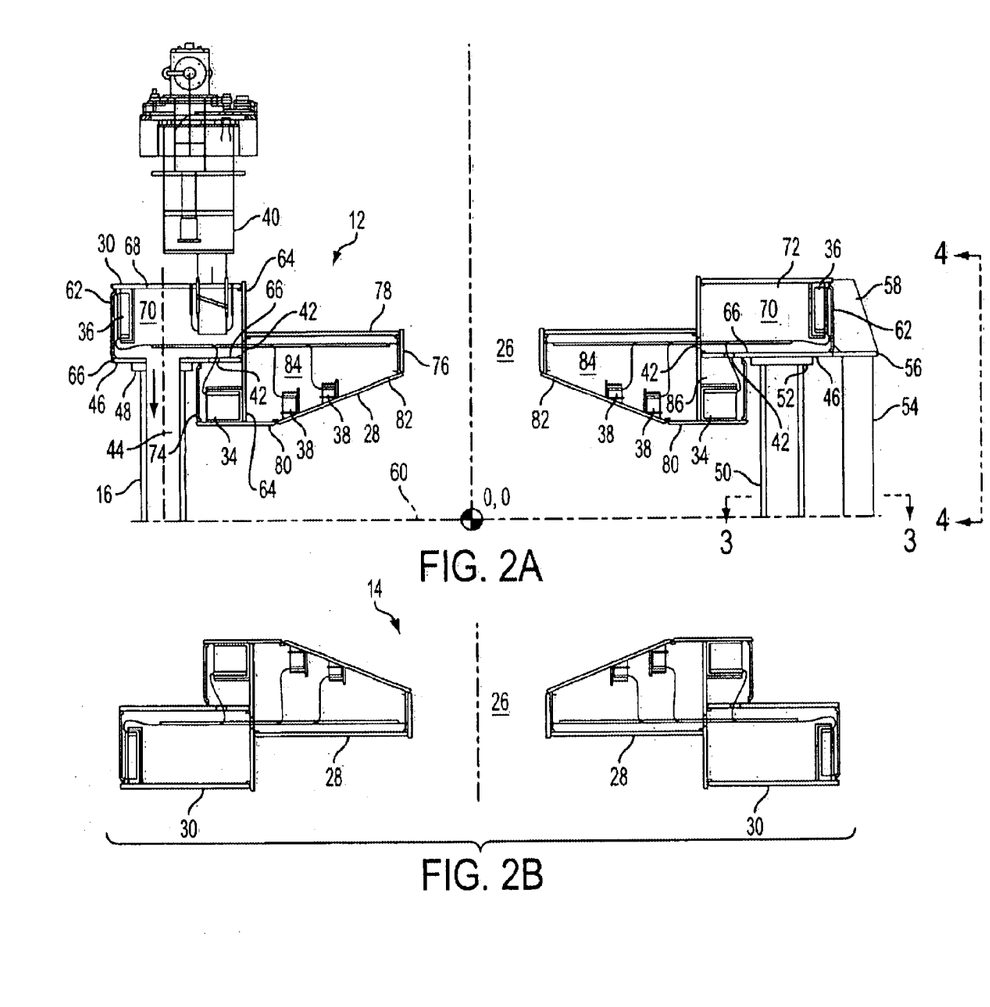

As seen in FIG. 2A, the first or upper half magnet section 12 houses a main magnet coil 34 and a shield coil 36. The main coil 34 and one or more field coils 38 are mounted in the hollow annular main coil portion 28 and the shield coil 36 is mounted in the hollow shield coil portion 30 which is located axially and radially outwardly from the main coil 34. Coolant, such as liquid helium, flows freely around and through the first or upper half magnet section 12. The helium vessel is filled with liquid helium. Magnet heat losses cause the liquid helium to boil off into gaseous helium. A two stage G-M cryocooler with a recondenser recondenses the gaseous helium back into liquid helium. Recondensed liquid helium is introduced from the cryocooler 40 into the shield coil portion 30 from which the helium flows into the main coil portion 28 via a series of passages, ducts or flow openings 42.

Liquid helium is also channeled axially through the first support 16 via flow passage 44. It is also possible to channel liquid helium through the radially inner portion 22 of the second support 18. In this manner, liquid helium may be directed to flow from the first or upper magnet half section 12 through the support 16 or supports 16 and 18 and into the second or lower magnet half section 14 shown in FIG. 2B, and vice versa.

As further seen in FIG. 2A, the first support 16 is formed as a hollow cylindrical pipe which is fixedly connected to the axially inner surface 46 of the shield coil portion 30 of both the first and second magnet half sections 12, 14. A mounting plate 48 is welded or bolted to both the upper and lower shield coil portions 30 and to the opposite ends of the first support 16 to form a strong rigid first interconnection between the first and second magnet half sections 12, 14.

When the main magnet coils 34 are electrically energized, the first and second magnet half sections are strongly attracted to one another. The first support 16 reacts this attractive force in pure compression and thereby prevents collapse of the magnet half sections into one another.

Figure 3:
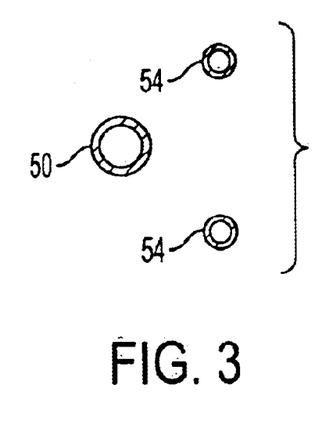
FIG. 3 is a view in section taken through section line 3—3 of FIG. 2A showing details of the large support for the helium vessel of FIG. 1.
Figure 4:
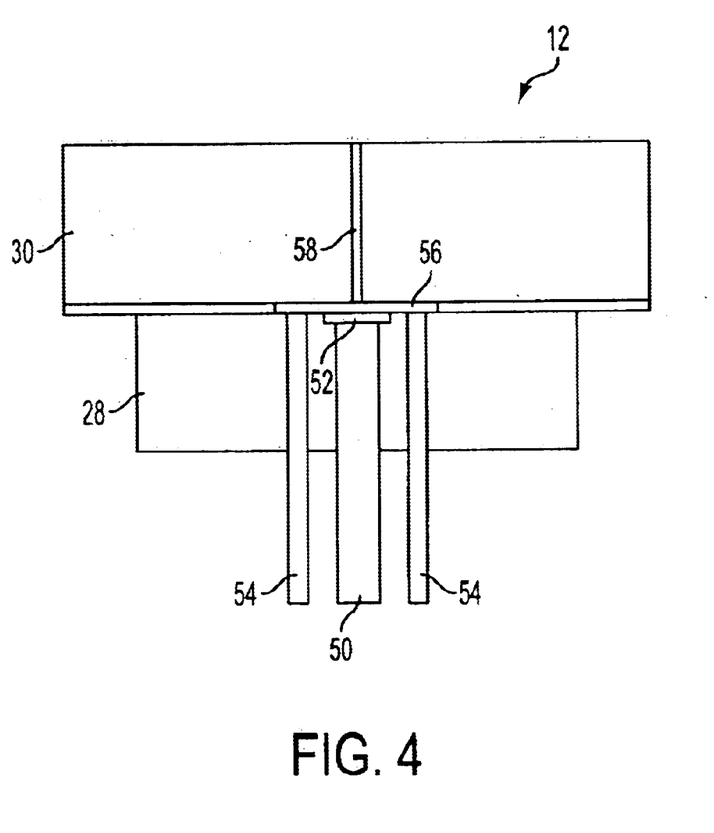
FIG. 4 is a right side view of FIG. 2A viewed along line 4—4 of FIG. 2A.

The second support 18 also reacts this axial load, but in a somewhat different fashion. That is, the second support 18 is actually formed of three separate columns or posts as seen in FIGS. 3 and 4. The first of these posts is a radially inner post 50 constructed substantially the same as the first support post 16. Post 50 is, in this example, formed of the same hollow pipe as the first support 16 and located at the same radial distance from the opening 26 as the first support.

Post 50, like the first support 16, reacts only compressive loads. A mounting plate 52 is welded or bolted to the axially inner surface 46 of the shield coil portion 30 to provide a rigid interconnection between the post 50 and the first or upper magnet half section 12.

Figure 9:
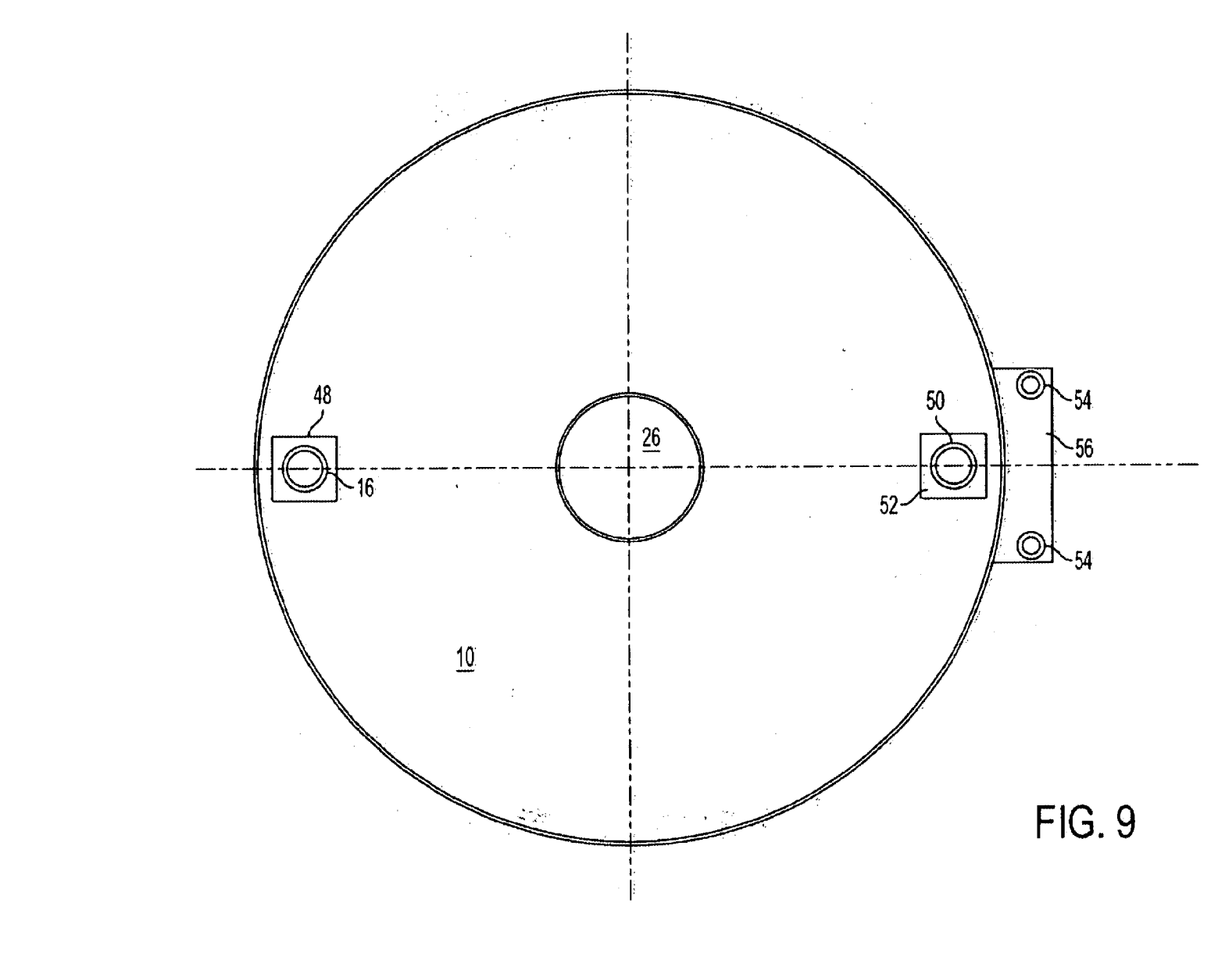
FIG. 9 is a top plan view of the helium vessel.

The second support 18 further includes, in addition to post 50, a pair of radially outer posts 54 which, as seen in FIGS. 3 and 4, are located radially outwardly and circumferentially offset equidistant from the radially inner post 50. The outer posts 54 are welded to a mounting bracket 56 which, as seen in FIG. 9, extends radially outwardly of the magnet half sections, i.e., from the bottom of radially outer shield coil portion 30. By locating the outer posts 54 radially outwardly of the helium vessel 10, that is, radially outwardly of both the main coil portion 28 and the shield coil portion 30, the openness of the gap 24 within the support structure is increased.

It should be noted that the first support 16 and the second support 18, including posts 50 and 54, are connected in the same manner to the second or lower magnet section 14 as that shown in the first or upper magnet section 12 in FIG. 2A. When an axial compressive load is applied to the first support 16 and radially inner post 50 by the magnet coils, the supports 16, and 50 are axially compressed. At the same time, an axial tensile force is applied to each of the radially outer posts 54 tending to stretch the posts 54. This tension-compression dual support arrangement provides great strength and shear and torsional rigidity, yet maintains a high degree of openness.

By circumferentially offsetting the two radially outer posts 54 on opposite sides of the radially inner post 50, the three posts 50, 54, 54 of the second support 18 provide a support structure which also resists and reacts circumferential torsional and shear loads. Moreover, by locating the first and second supports diametrically opposite one another and radially outwardly from the inner magnet coil portions 28, the support structure of the magnet half sections 12, 14 has very high bending, shear and torsional natural frequencies, which makes the MRI magnet assembly more tolerant to floor induced vibrations.

The rigidity of the second support 18 can be further increased by interconnecting the posts 50, 54 with braces or shear panels. As further seen in FIG. 2A and FIG. 4, a brace plate 58 is welded to the mounting bracket 56 and to the radially outer magnet coil portion 30 to provide an even greater rigidity to the support structure which rigidly separates the magnet half sections 12, 14. An identical brace plate is provided on the lower magnet half section which is symmetrical with the upper magnet half section about central radial plane 60.

It should be noted that the largest electromagnetic forces occur on the main coil 34 and shield coil 36. For this reason, the magnet half sections 12, 14 are strongly reinforced in these areas. This strength is provided by a series of concentric cylindrical structural support members and a series of radially-extending circumferentially-spaced gusset plates as described below.

The radially outer shield coil portions 30 are constructed of a radially outer cylinder 62 and a radially inner cylinder 64. These cylinders are welded or rigidly connected to an annual, axially-inner flange 66 and to an annular, axially outer flange 68 so as to form a first annular chamber 70 for securely housing the shield coil 36. The radially inner cylinder 64 extends from the shield coil portion 30 into the main coil portion 28 to increase the overall strength and rigidity of both magnet coil portions 28, 30.

Additional rigidity is provided to each of the magnet half sections 12, 14 by a series of radially-extending circumferentially-spaced gusset plates 72. Plates 72 may be welded to the inner and outer flanges 66, 68 as well as to the inner cylinder 64. From 8 to 32 (or more) gussets plates 72 may be used to reinforce the magnet half sections 12, 14 via arrangement in a spoke-like array as seen in FIG. 8.

The radially inner magnet coil portions 28 are rigidly constructed with a radially outer cylinder 74, the radially inner cylinder 64 and a central cylinder 76. An annular, axially-outer plate 78 rigidly interconnects the central cylinder 76 and the radially inner cylinder 64. An annular, axially inner plate 80 rigidly interconnects the radially outer cylinder 74 and the radially inner cylinder 64.

A frusto-conical ring 82 rigidly interconnects the axially inner plate 80 and the central cylinder 76 to help define a second annular chamber 84 which houses the secondary or field coils 38. Ring 82 converges axially outwardly and radially inwardly from axial gap 24 to maximize the openness of the support structure. A third annular chamber 86 is defined between the annular flange 66, the axially inner plate 80, the radially outer cylinder 74 and the axially inner portion of the radially inner cylinder 64. This third chamber 64 is particularly structurally robust to accommodate the main coil 34 and its high magnetic forces.

Figure 5A:
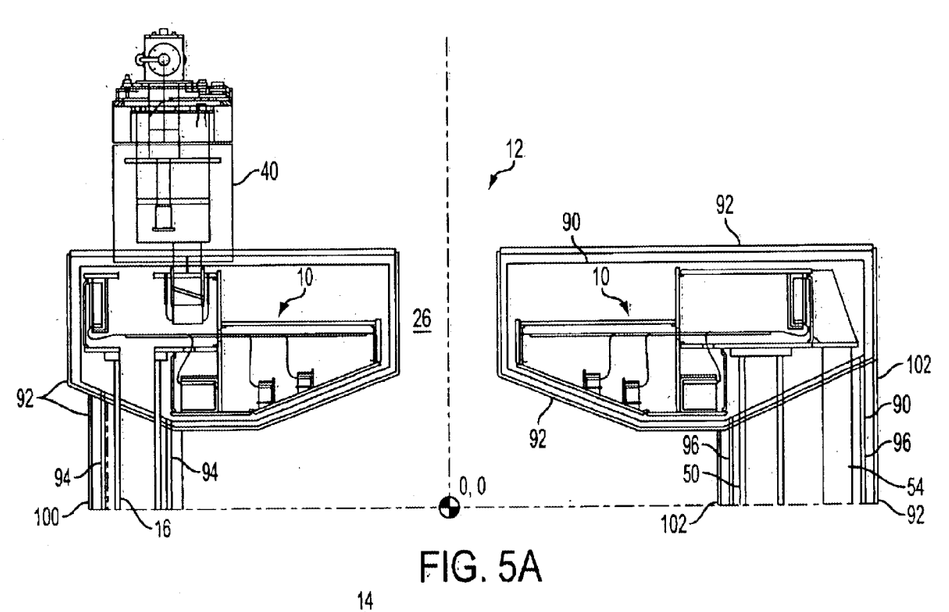
FIGS. 5A and 5B are axial cross sectional views through the helium vessel of FIGS. 2A and 2B and through the surrounding thermal shield and outer vacuum container, and respectively taken through the same sections as in FIGS. 2A and 2B.
Figure 5B:
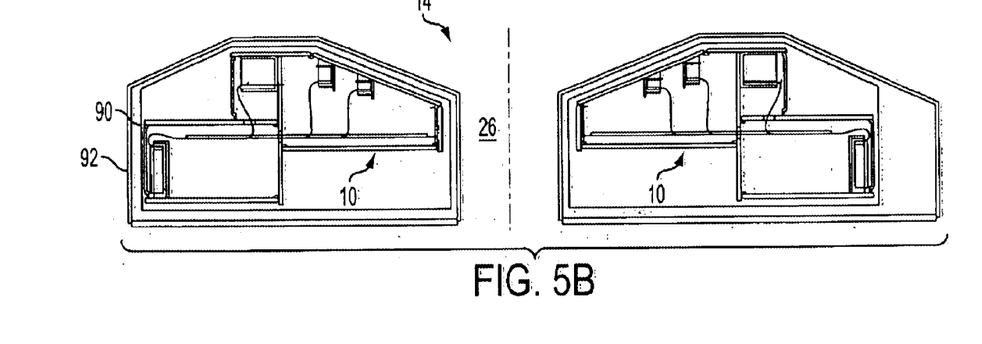
Figure 8:
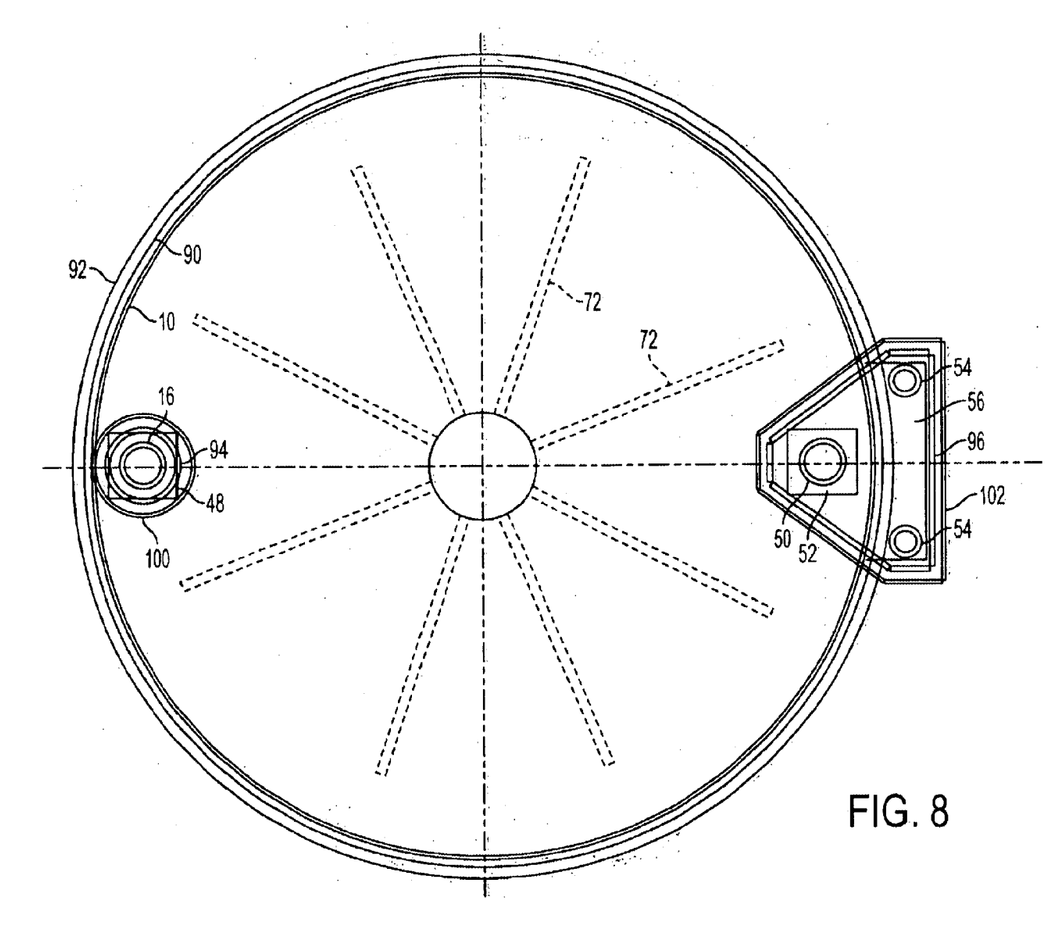
FIG. 8 is a top plan view of FIG. 5A, with the cryocooler removed for clarity.

As seen in FIGS. 5A, 5B and 8, the helium vessel 10 is enclosed in a thermal shield 90 and an outer vacuum jacket or container 92. The thermal shield 90 is cooled down by the first stage of the two stage G-M cryocooler 40. The second stage of the cryocooler is used as a helium recondenser in order to reduce the system liquid helium boil-off.

Figure 6A:
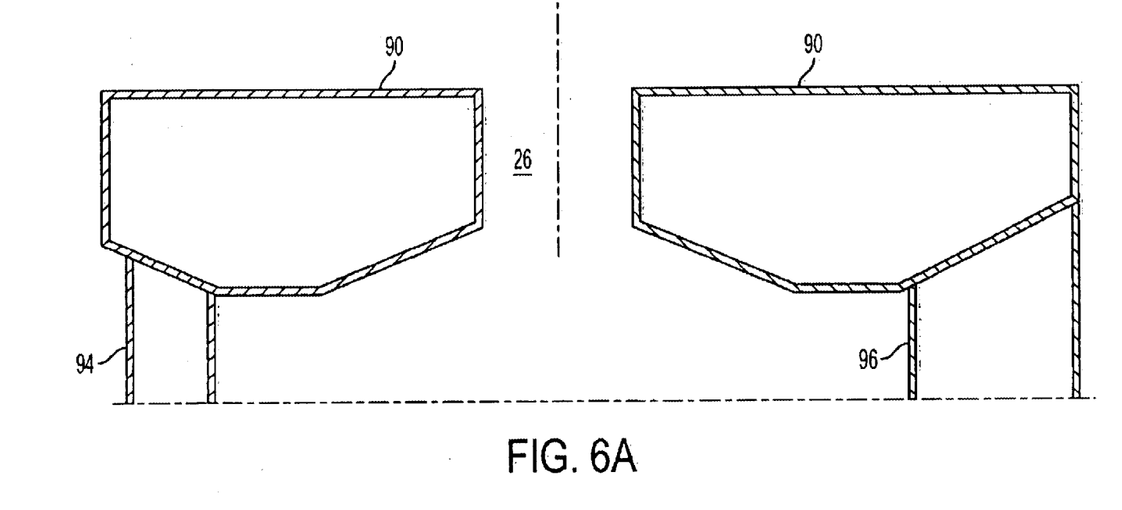
FIGS. 6A and 6B are respective cross sectional views of the thermal shield of FIGS. 5A and 5B, taken through the same respective sections as in FIGS. 5A and 5B.
Figure 6B:
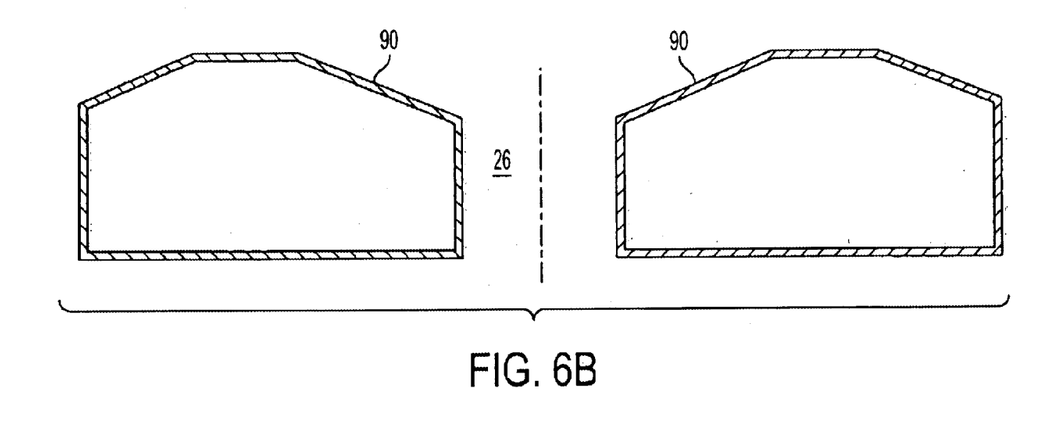
Figure 10:
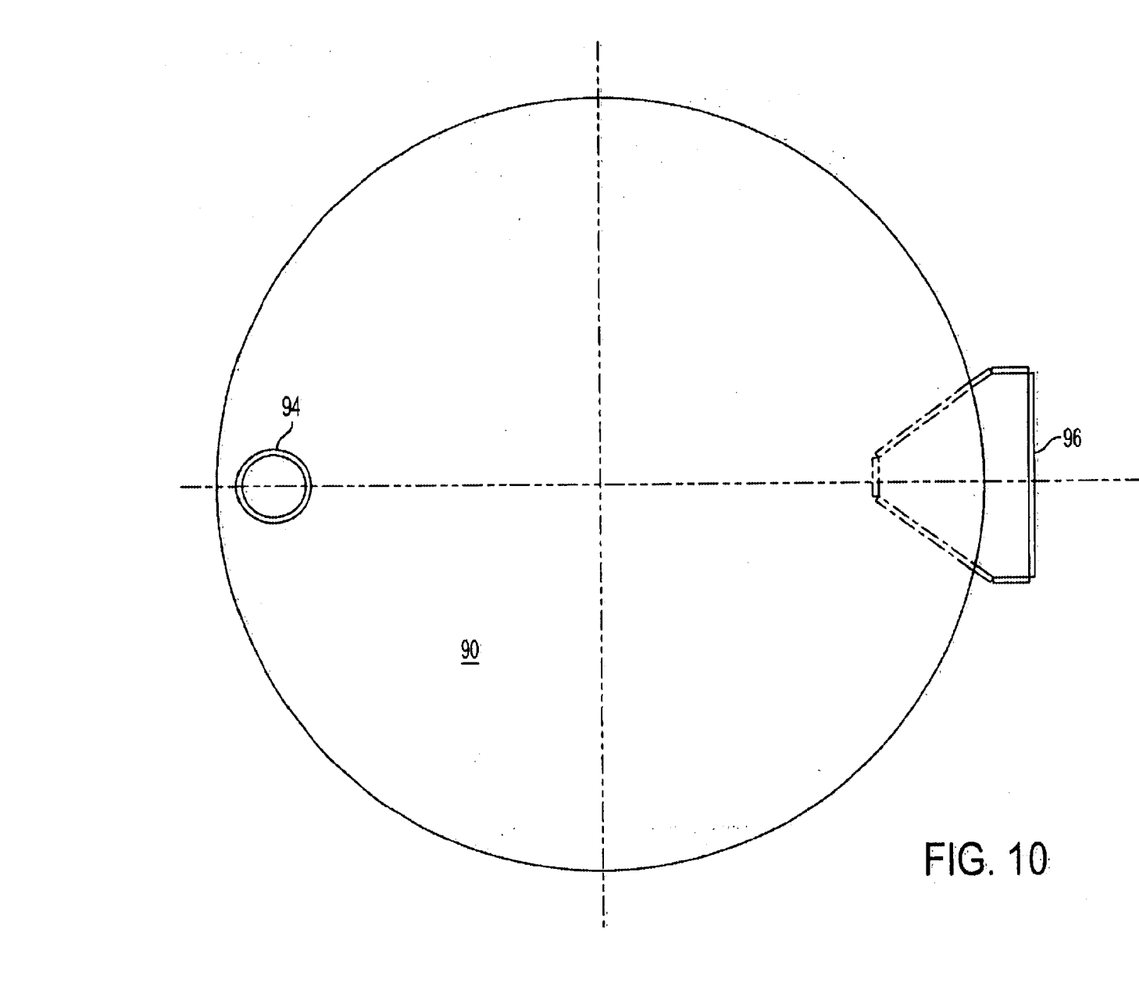
FIG. 10 is a top plan view of the thermal shield.

Preferably, the thermal shield 90 shown in FIGS. 6A and 6B is fabricated as a light compact construction made of a high thermal conductivity aluminum alloy such as aluminum alloy 1100. The thermal shields 90 enshrouding each magnet half section 12, 14 are securely and rigidly interconnected with one another by a pair of small and large thermal shield posts or columns 94, 96 as shown in FIGS. 5A and 6A. The small thermal shield post 94 is cylindrical in section and the large thermal shield post 96 has a polygonal, hexagonal or six sided section as seen in FIG. 10, to achieve maximum compactness in cross section and thereby provide maximum openness. The six sided post 96 flares or diverges radially outwardly so as to limit physical and visual obstruction of the patient imaging region.

Figure 7A:
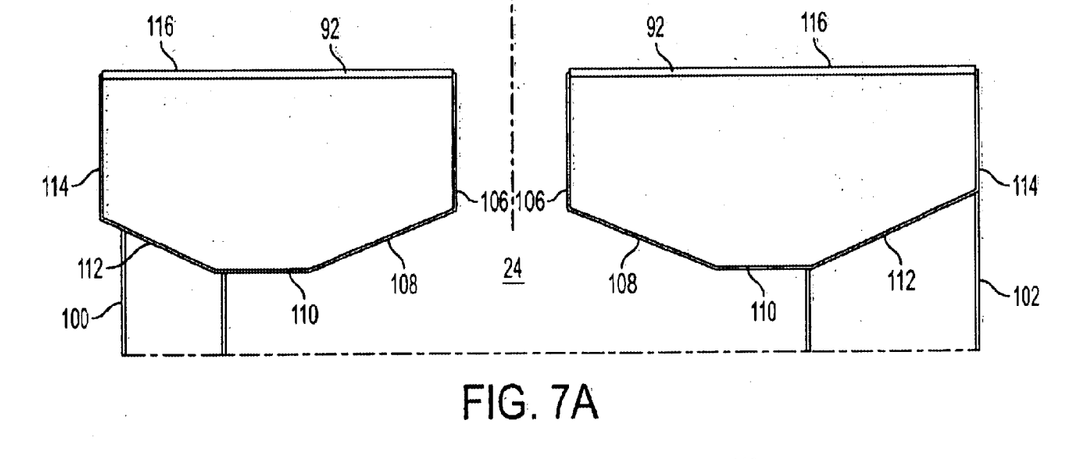
FIGS. 7A and 7B are respective axial cross sectional views of the outer vacuum container of FIGS. 5A and 5B, taken through the same respective sections as in FIGS. 5A and 5B.
Figure 7B:
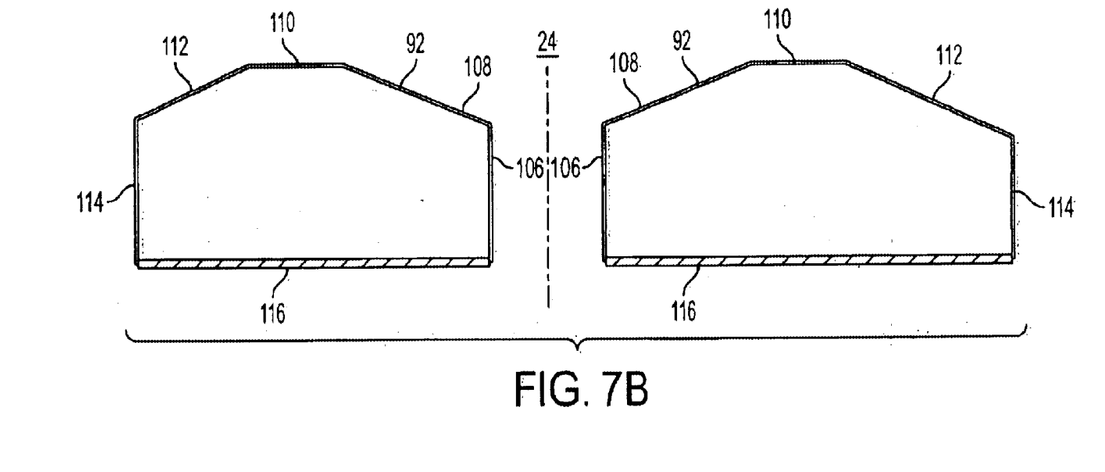
Figure 11:
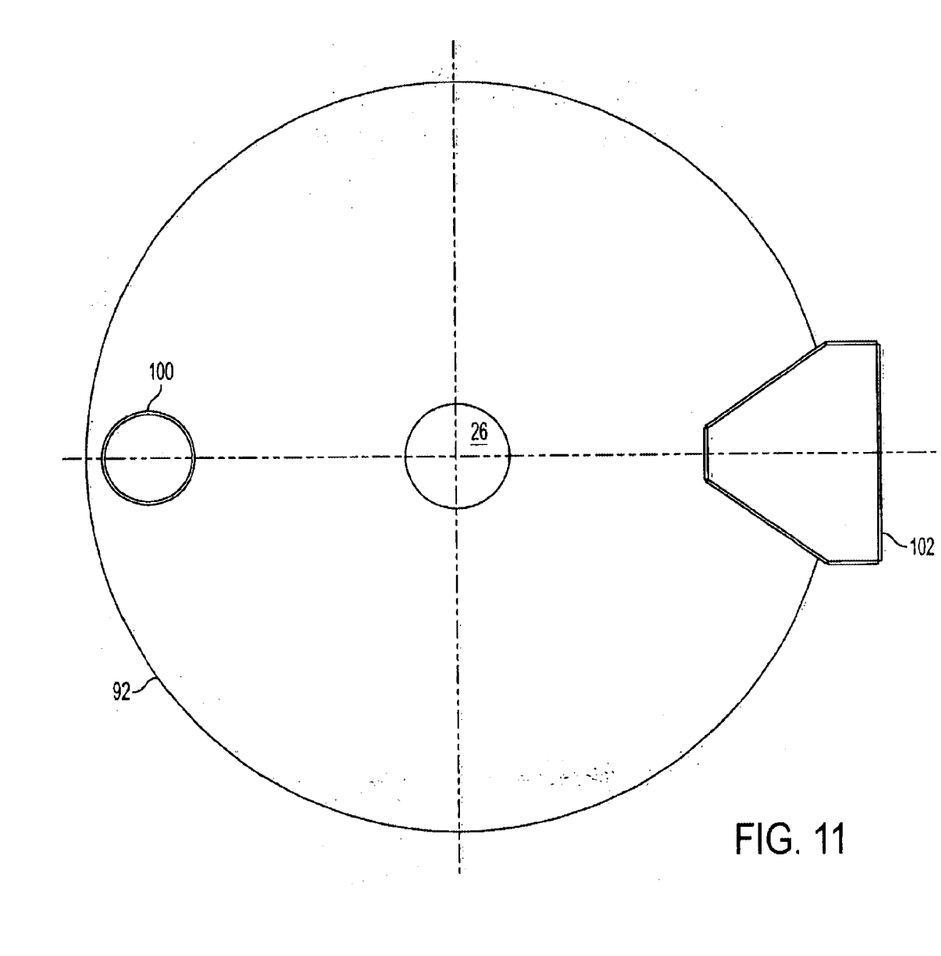
FIG. 11 is a top plan view of the outer vacuum container.

Both the helium vessel support posts 16, 50, 54 and the thermal shield posts 94, 96 are enclosed in the outer vacuum container posts 100, 102, as seen in FIG. 5A. The posts 100, 102 rigidly interconnect the two halves of the outer vacuum container 92 together. The upper half of the container 92 is shown in FIG. 7A and the lower half is shown in FIG. 7B. A top view of the outer vacuum container is shown in FIG. 11. Post 100 is cylindrical in shape and post 102 is six sided to compliment the six sided section of the thermal shield post 96.

Both the helium vessel 10 and the thermal shield 90 are enclosed in the outer vacuum container 92. As further seen in FIGS. 7A and 7B, the upper half of the vacuum container shown in FIG. 7A and the lower half of the vacuum container shown in FIG. 7B are each constructed from a radially inner cylinder 106, a radially inner cone 108, an axially inner annular flange 110, a radially outer cone 112, a radially outer cylinder 114 and an axially outer flange 116.

The inner and outer cones 108, 112 increase the perceived openness of the magnet opening 24 from the perspective of a patient as compared to a uniform gap defined by an extension of annular flanges 110 completely across the gap 24. Both the helium vessel assembly and the thermal shield are suspended from the outer vacuum container via a composite strap suspension system of known construction. The spacing between the outer vacuum container and the thermal shield is filled with multiple layers of insulating material, in order to keep the thermal losses of the system to a minimum. The vertical opening of the magnet is approximately 45–50 cm, which is sufficient for patient imaging.

While the invention has been described in the specification and illustrated in the drawings with reference to a preferred embodiment, it will be understood by those skilled in the art that various changes may be made and equivalents may be substituted for elements thereof without departing from the scope of the invention as defined in the claims.

What is claimed is:

1. An open superconducting MRI apparatus comprising a first magnet section on top, a second magnet section on the bottom together defining an open system with a vertical magnetic field, and
a support structure interconnecting and supporting the first and second magnet sections during operation of the MRI apparatus, said support structure having at least a first support and a second support and wherein the first support is two opposed compressive supports and the second support is a tensive support in combination with one of the compressive supports.

2. An open superconducting MRI apparatus comprising a first magnet section on top, a second magnet section on the bottom together defining an open system with a vertical magnetic field, and
a support structure interconnecting and supporting the first and second magnet sections during operation of the MRI apparatus, said support structure having at least a first support and a second support and wherein the first support is two opposed compressive supports and the second support is a support carrying tensive load components in combination with one of the compressive supports.

3. The apparatus of claim 2, wherein said first and second magnet sections comprise cylindrical members, and wherein said first and second supports are connected to said cylindrical members at substantially diametrically opposed positions.

4. The apparatus of claim 2, wherein said first support comprises a hollow pipe adapted to channel cooling fluid between said first and second magnet sections.

5. The apparatus of claim 2, wherein said first and second magnet sections each comprises a main magnet coil portion and a shield magnet coil portion separated from said main magnet coil portion.

6. The apparatus of claim 5, wherein said main magnet coil portion comprises a first pair of cylindrical walls and said shield magnet coil portion comprises a second pair of cylindrical walls.

7. The apparatus of claim 6, wherein one of said second pair of cylindrical walls extends into said main magnet coil portion.

8. The apparatus of claim 2, wherein said first magnet section comprises three chambers.

9. The apparatus of claim 8, wherein each of said three chambers comprises an annular chamber.

10. The apparatus of claim 2, wherein said second support comprises a radially outer support located radially outwardly of said first and second magnet sections.

11. The apparatus of claim 10, wherein said radially outer support is loaded under tension.

12. The apparatus of claim 2, wherein said second support comprises a radially inner support located radially inwardly of said first and second magnet sections.

13. The apparatus of claim 2, wherein said second support comprises a radially inner support post and a pair of radially outer support posts positioned radially outwardly of said radially inner support post.

14. The apparatus of claim 13, wherein said pair of radially outer support posts are circumferentially offset on opposite sides of said radially inner support post.

15. The apparatus of claim 2, further comprising a thermal shield surrounding said first and second supports.

16. The apparatus of claim 15, wherein said thermal shield comprises a cylindrical support column surrounding said first support and a polygonal support column surrounding said second support.

17. The apparatus of claim 16, wherein said polygonal support column comprises a six sided column.

18. The apparatus of claim 16, wherein said polygonal support column has a cross section which diverges radially outwardly.

19. The apparatus of claim 2, wherein each of said first and second magnet sections comprises a frusto-conical portion which converges axially and radially inwardly.

20. The apparatus of claim 2 the rigidity of each magnet section is maintained by a series of radially extending circumferentially-spaced gusset plates.

21. The apparatus of clam 20 comprising a series of cylinders so as to further maintain the rigidity of the first and second magnet sections.

* * * * *